United States Patent
Ranjan et al.

(10) Patent No.: US 8,593,862 B2
(45) Date of Patent: Nov. 26, 2013

(54) SPIN-TRANSFER TORQUE MAGNETIC RANDOM ACCESS MEMORY HAVING MAGNETIC TUNNEL JUNCTION WITH PERPENDICULAR MAGNETIC ANISOTROPY

(75) Inventors: Rajiv Yadav Ranjan, San Jose, CA (US); Roger Klas Malmhall, San Jose, CA (US)

(73) Assignee: Avalanche Technology, Inc., Fremont, CA (US)

( * ) Notice: Subject to any disclaimer, the term of this patent is extended or adjusted under 35 U.S.C. 154(b) by 373 days.

(21) Appl. No.: 12/641,244

(22) Filed: Dec. 17, 2009

(65) Prior Publication Data
US 2010/0096716 A1    Apr. 22, 2010

Related U.S. Application Data

(63) Continuation-in-part of application No. 11/674,124, filed on Feb. 12, 2007, now Pat. No. 8,084,835, and a continuation-in-part of application No. 11/739,648, filed on Apr. 24, 2007, and a continuation-in-part of application No. 11/776,692, filed on Jul. 12, 2007, now Pat. No. 8,063,459.

(60) Provisional application No. 61/138,493, filed on Dec. 17, 2008.

(51) Int. Cl.
*G11C 11/00* (2006.01)
*H01L 29/82* (2006.01)

(52) U.S. Cl.
USPC ...... 365/158; 365/171; 257/421; 257/E29.323

(58) Field of Classification Search
USPC .................. 257/421, E29.323; 365/158, 171
See application file for complete search history.

(56) References Cited

U.S. PATENT DOCUMENTS

| | | |
|---|---|---|
| 2005/0184839 A1* | 8/2005 | Nguyen et al. ............. 335/173 |
| 2007/0086121 A1 | 4/2007 | Nagase et al. |
| 2007/0171694 A1 | 7/2007 | Huai et al. |
| 2008/0253174 A1 | 10/2008 | Yoshikawa et al. |

* cited by examiner

*Primary Examiner* — Allison P Bernstein
(74) *Attorney, Agent, or Firm* — Maryam Imam; IPxLAW Group LLP

(57) ABSTRACT

A spin-torque transfer memory random access memory (STT-MRAM) element includes a fixed layer formed on top of a substrate and a tunnel layer formed upon the fixed layer and a composite free layer formed upon the tunnel barrier layer and made of an iron platinum alloy with at least one of X or Y material, X being from a group consisting of: boron (B), phosphorous (P), carbon (C), and nitride (N) and Y being from a group consisting of: tantalum (Ta), titanium (Ti), niobium (Nb), zirconium (Zr), tungsten (W), silicon (Si), copper (Cu), silver (Ag), aluminum (Al), chromium (Cr), tin (Sn), lead (Pb), antimony (Sb), hafnium (Hf) and bismuth (Bi), molybdenum (Mo) or rhodium (Ru), the magnetization direction of each of the composite free layer and fixed layer being substantially perpendicular to the plane of the substrate.

18 Claims, 6 Drawing Sheets

SPIN-TRANSFER TORQUE MAGNETIC RANDOM ACCESS MEMORY HAVING MAGNETIC TUNNEL JUNCTION WITH PERPENDICULAR MAGNETIC ANISOTROPY

CROSS REFERENCE TO RELATED APPLICATIONS

This application claims priority to U.S. Provisional Patent Application No. 61/138,493, filed on Dec. 17, 2008 by Ranjan et al. and is a continuation-in-part of U.S. patent application Ser. No. 11/674,124, filed on Feb. 12, 2007 and entitled "Non-uniform switching based non-volatile magnetic based memory" by Rajiv Yadav Ranjan and a continuation-in-part of U.S. patent application Ser. No. 11/739,648, filed on Apr. 24, 2007, and entitled "Non-volatile magnetic memory with low switching current and high thermal stability" by Rajiv Yadav Ranjan and a continuation-in-part of U.S. patent application Ser. No. 11/776,692, filed on Jul. 12, 2007, and entitled "Non-Volatile Magnetic Memory Element With Graded Layer" by Rajiv Yadav Ranjan, which are all incorporated herein by reference as though set forth in full.

BACKGROUND OF THE INVENTION

1. Field of the Invention

The present invention relates to a spin-transfer torque (STT) magnetic random access memory (MRAM), and, more particularly, to an STTMRAM element having magnetic moments oriented perpendicular to the plane of the substrate, and having lower programming current density while maintaining higher thermal stability.

2. Description of the Prior Art

Magnetic random access memory (MRAM) and resistive RAM (RRAM), which are a type of non-volatile memory, have gained great notoriety within recent years; however, efforts to improve their practicality of manufacturing and operation are well under way. These types of memory, which switch between a parallel and an anti-parallel states through the application of spin polarized current during programming, is also being investigated.

One type of MRAM is spin-transfer torque magnetic random access memory (STTMRAM). While STTMRAM are expected to be a universal memory solution, various hurdles stand in the way. The programming current of STTMRAM is still very high as main memory, therefore, the cell size is too large thereby preventing its adoption in consumer devices. Scaling STTMRAM below 65 nm is ideal; however reducing the programming current and shrinking the cell size introduces a variety of issues, such as thermal instability.

STTMRAM has significant advantages over magnetic-field-switched (toggle) MRAM, which has been recently commercialized. The main hurdles associated with field switched MRAM are its more complex cell architecture, which utilizes bypass line and remote write lines. Additional hurdles include its high write current (currently in the order of milliamps (mA)) and poor scalability, which cannot scale beyond 65 nano meters (nm). The fields and the currents required to write the bits increase rapidly as the size of the MTJ elements shrink. STT writing technology, by directly passing a current through the MTJ, overcomes these hurdles with much lower switching current (in the order of microamps (uA)), simpler cell architecture which results in a smaller cell size (for single-bit cells) and reduced manufacturing cost, and more importantly, improved scalability.

One of the challenges for implementing STT, is that during writing mode, such memory used in high-density and high-speed memory applications, require substantial reduction of the intrinsic current density to switch the magnetization of the free layer while maintaining high thermal stability, which is required for long-term data retention. Minimal switching (write) current is required mainly for reducing the size of the select transistor of the memory cell, which is typically coupled, in series, with MTJ to achieve the highest possible memory density. The channel width (in unit of F) of the transistor is proportional to the write current for a given transistor current drivability (uA/um). Minimal channel width or the width of MTJ element is required for achieving a reduced STTMRAM cell size. Second, smaller voltage across MTJ decreases the probability of tunneling barrier degradation and breakdown, ensuring write endurance of the device. This is particularly important for STTMRAM, because both sense and write currents are driven through MTJ cells.

One of the efficient way to reduce the programming current in STTMRAM is to use a MTJ with perpendicular anisotropy.

Incorporation of MgO-based MTJ with conventional perpendicular anisotropy material(s), such as FePt, into STTMRAM with such MTJ designs cause high damping constant, high magnetic anisotropy leading to undesirably high switching current density. Furthermore, during manufacturing, conventional higher ordering transformation temperature required for forming L10 order structure could undesirably degrades or even obliterates tunneling magneto-resistance (TMR) performance.

What is needed is a STTMRAM element having a MTJ with perpendicular magnetic anisotropy material(s) with an optimal combination of saturation magnetization (Ms) and anisotropy constant (Ku) to lower the damping constant and the magnetic anisotropy of the MTJ yielding a lower switching current density associated with the MTJ while maintaining high thermal stability and high TMR performance.

SUMMARY OF THE INVENTION

To overcome the limitations in the prior art described above, and to overcome other limitations that will become apparent upon reading and understanding the present specification, the present invention discloses a method and a corresponding structure for a magnetic storage memory device that is based on current-induced-magnetization-switching having reduced switching current in the magnetic memory.

Briefly, an embodiment of the present invention includes a spin-torque transfer memory random access memory (STTMRAM) element that has a fixed layer having a first magnetization that is substantially fixed in one direction and formed on top of a substrate and a tunnel layer formed upon the fixed layer and a composite free layer having a second magnetization that is switchable in two directions and formed upon the tunnel barrier layer. The composite free layer is made of an iron platinum alloy with at least one of X or Y material, X being from a group consisting of: boron (B), phosphorous (P), carbon (C), and nitride (N) and Y being from a group consisting of: tantalum (Ta), titanium (Ti), niobium (Nb), zirconium (Zr), tungsten (W), silicon (Si), copper (Cu), silver (Ag), aluminum (Al), chromium (Cr), tin (Sn), lead (Pb), antimony (Sb), hafnium (Hf) and bismuth (Bi), molybdenum (Mo) or rhodium (Ru), the magnetization direction of each of the composite free layer and fixed layer being substantially perpendicular to the plane of the substrate. During a write operation, a bidirectional electric current is applied across the STTMRAM element switching the second magnetization between parallel and anti-parallel states relative to the first magnetization.

These and other objects and advantages of the present invention will no doubt become apparent to those skilled in the art after having read the following detailed description of the preferred embodiments illustrated in the several figures of the drawing.

IN THE DRAWINGS

DETAILED DESCRIPTION OF THE PREFERRED EMBODIMENTS

Figure 1:
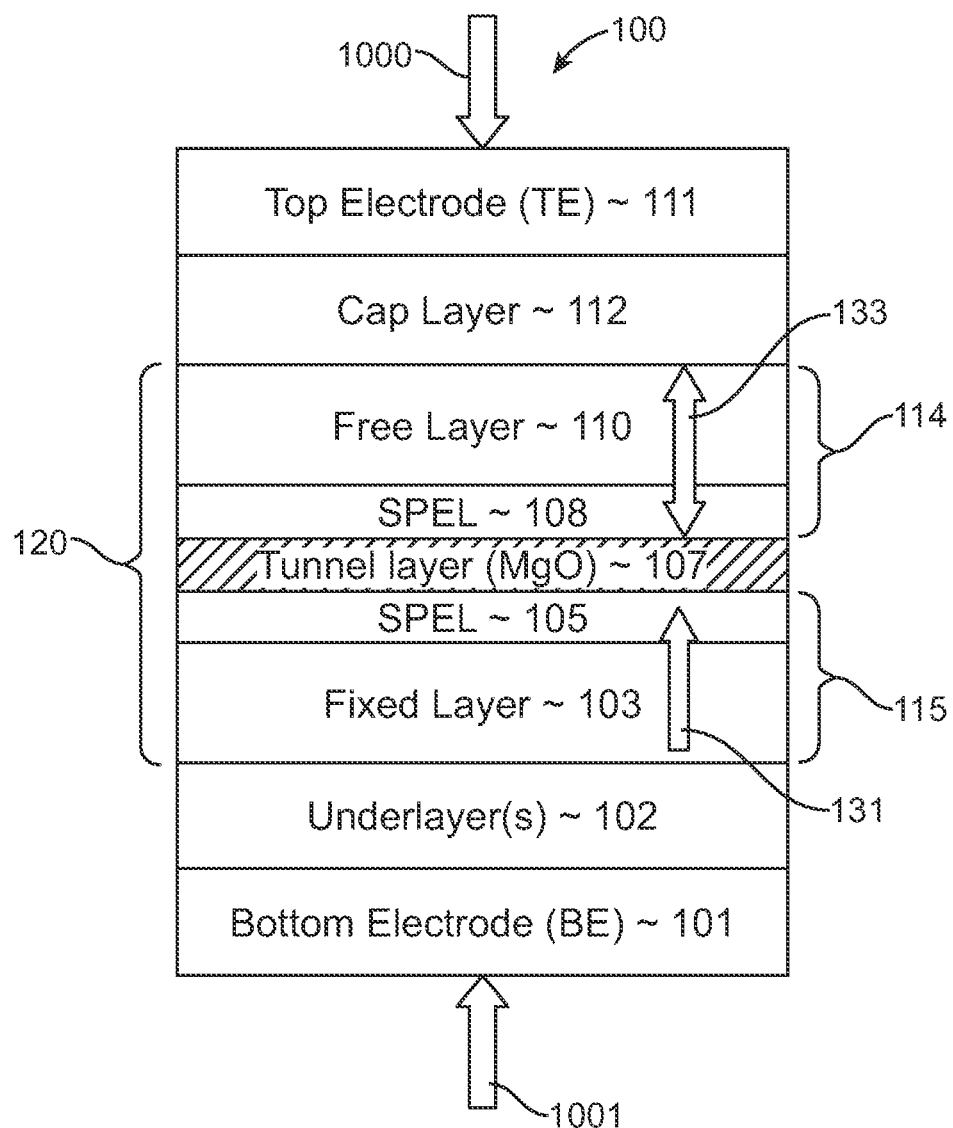
FIG. 1 shows the layers of STTMRAM element 100, in accordance with an embodiment of the present invention.

In the following description of the embodiments, reference is made to the accompanying drawings that form a part hereof, and in which is shown by way of illustration of the specific embodiments in which the invention may be practiced. It is to be understood that other embodiments may be utilized because structural changes may be made without departing from the scope of the present invention. It should be noted that the figures discussed herein are not drawn to scale and thicknesses of lines are not indicative of actual sizes.

In accordance with an embodiment of the present invention, a spin-transfer torque magnetic random access memory (STTMRAM) element includes a magnetic tunnel junction (MTJ) having a fixed layer and a free layer wherein the magnetic orientation of fixed layer and free layer is substantially perpendicular to the plane of the layers. The selection of the magnetic alloy for use in each of the fixed layer and the free layer, as disclosed herein, advantageously reduces the switching current density, and increases reliability in single domain switching. In an exemplary embodiment, the switching current density is less than 1 mega amp per centimeter squared (MA/cm$^2$) while maintaining high thermal stability. Thermal stability is defined by KuV/kT. Ku represents magnetic anisotropy constant, V represents the volume of the free layer, k is Boltzmann's constant and T represents temperature. In an exemplary embodiment, high thermal stability is greater than 40.

In one embodiment, the fixed layer and free layer each are made of iron platinum doped alloy (FePtXY). X and Y each represent a material. For example, X represents any one of the materials: boron (B), phosphorous (P), carbon (C), nitride (N) and Y represents any of the materials: tantalum (Ta), titanium (Ti), niobium (Nb), zirconium (Zr), tungsten (W), silicon (Si), copper (Cu), silver (Ag), aluminum (Al), chromium (Cr), tin (Sn), lead (Pb), antimony (Sb), hafnium (Hf) and bismuth (Bi), molybdenum (Mo) or rhodium (Ru). In one embodiment, either X or Y is employed. In another embodiment, both X and Y are employed. X and Y are each doping materials (dope the essential material, such as FePt of FePtNi) and dilute the FePt or FePtNi alloys to obtain the desired Ku (anisotropy constant) and Ms (saturation magnetization) combination for reducing the damping constant, magnetization (Ms), and for reducing the distribution of perpendicular magnetic anisotropy. X is an interstitial element and Y is a trapping element. That is, Y serves to trap X during annealing, otherwise without the presence of Y, X may be undesirably diffused during annealing. In one embodiment, each of the materials X and Y have a concentration of 3-15 atomic percentage. X and/or Y also aid in lattice matching of subsequent (adjacent) layers above the layer which contains the X and/or Y.

While either the free layer or fixed layer may be formed on material that is doped with X or Y, it is understood that the damping constant and the magnetic perpendicular anisotropy of the fixed layer are much larger than that of the free layer.

Annealing, as known to those skilled in the art, is performed during manufacturing of the MTJ of the STTMRAM element to promote desired crystalline texture for higher TMR performance. In addition, the doped alloys, such as FePtXY, ensure reliable single domain switching. Single domain refers to uniform magnetization orientation throughout the same layer. In accordance with an embodiment of the present invention, all materials and alloys are selected with various goals in mind. First, an optimized combination of magnetic anisotropy constant ($K_u$), saturation magnetization ($M_s$) for low damping, and single domain reliable switching are achieved. Doping elements such as, B, P, C, N, Ta, Ti, Nb, Zr, W, Si, Cu, and Ag are used to dope an essential element, such as FePt. These elements lower the $M_s$ and $K_u$, ensuring that the anisotropy field of the MTJ is substantially perpendicular, and greater than 4πMs, where π represents 'pi' and commonly used in mathematical equations. Second, the various layers of the embodiments of the present invention may be grown in an L10 crystal structure, ideal for perpendicular anisotropy. Third, each layer may be grown to match the lattice constant of the subsequent (or adjacent) layer, in cubic (001) texture, to increase the tunnel magnetoresistance (TMR) effect. Fourth, a lower damping constant reduces the programming current density ($J_{co}$) of the MTJ. Fifth, an enhanced spin-polarization interface layer may be formed between the magnesium oxide (MgO) barrier layer and the adjacent pinned (or fixed) layer and the barrier layer and the free layer. This enhanced spin-polarization interface layer (SPEL) may be made of a cobolt iron boron (CoFeB)-based alloy. In alternative embodiments, CoFe-based alloys are employed, such as but not limited to CoFeTa or CoFeZr.

It is noted that by doping XY into FePt, the L10 ordering transformation temperature is lowered to preferably below 400 degrees C. The L10 ordering transformation temperature as used herein refers to the L10 FePt structure required for effectuating perpendicular anisotropy field, $H_k$.

The dependence of magnetic properties on a preferred direction of magnetization is referred to as "Magnetic anisotropy". Magnetic anisotropy is also of considerable practical importance because it is exploited in the design of most magnetic materials of commercial importance.

Referring now to FIG. 1, the relevant layers of a STTMRAM element 100 are shown, in accordance with an embodiment of the present invention. STTMRAM element 100 is shown to comprise: bottom electrode (BE) 101, one or more underlayer(s) 102, fixed layer 103, spin polarization enhanced (interface) layer (SPEL) layer 105, tunnel (or barrier) layer 107, SPEL layer 108, free layer 110, cap layer 112 and top electrode (TE) 111.

The BE 101 is, as known to those skilled in the art, typically formed on top of the substrate (not shown in FIG. 1). The underlayer 102, which in one embodiment is multi-layered and in another embodiment is a single layer, is formed on top of the BE 101. The fixed layer 103 is formed on top of the underlayer 102. The SPEL 105 is formed on top of the fixed layer 103. The tunnel layer 107 is formed on top of the SPEL 105. The SPEL 108 is formed on top of the tunnel layer 107. The free layer 110 is formed on top of the SPEL 108. The cap layer 112 is formed on top of the free layer 110 and the TE 111 is formed on top of the cap layer 112.

The cap layer helps the free layer. That is, in one embodiment of the present invention, the cap layer 112 reduces damping during switching of the magnetization direction of the element 100, when such switching occurs, for example, during a write operation. In one embodiment, the cap layer 112 is made of X and/or Y, as discussed above. In another embodiment, the cap layer 112 is made of a thin insulating oxide layer and on top thereof is formed the X and/or Y, accordingly, making the cap layer 112 a multi-layered structure. In one embodiment, the thin insulating layer comprising the cap layer 112 is made of MgO, AlO, HfO or any other oxide layer.

The SPEL 108 and the free layer 110, in combination, comprise a composite free layer 114. The fixed layer 103 and the SPEL 105, in combination, comprise a composite fixed layer 115. An MTJ 120 is formed from the combination of the composite fixed layer 115, the tunnel layer 107 and the composite free layer 114. In one embodiment of the present invention, the SPEL 105 is optional and in its absence, the tunnel layer 107 is formed directly on top of the fixed layer 103 with no SPEL 105 between the fixed layer 103 and the tunnel layer 107.

The magnetization of the fixed layer 103, as with respect to all of the fixed layers of the various embodiments of the present invention, is substantially fixed in one direction but the magnetization of composite free layer 114, as with respect to all of the fixed layers of the various embodiments of the present invention, is switchable. In FIG. 1, the magnetization direction of both the fixed layer 103 and the free layer 110 is substantially perpendicular relative to the plane of the substrate onto which the element 100 is formed.

In an exemplary embodiment, the tunnel layer 107 is made of magnesium oxide (MgO). In an exemplary embodiment, the BE 101 is made of metal, such as but not limited to copper (Cu) or tungsten (W). In an exemplary embodiment, the layers 105 and 108 are each made of CoFeB. In an exemplary embodiment, the cap layer 112 is made of tantalum (Ta) or titanium (Ti) and the TE 111 is made of metal, such as but not limited to copper (Cu) or tungsten (W).

Proper formation of underlayer(s) 102 is critical to ensure proper crystalline growth of the subsequently deposited layers, i.e., layers 103-112. In one embodiment, the crystalline growth of the fixed layer 103 and the free layer 110 is L10, which is a well known type of crystal structure. Arrows 131 and 133 indicate the magnetization direction of composite fixed layer 115 and composite free layer 114, respectively. Arrows 131 and 133 indicate that the magnetization direction of each of layers 115 and 114 is perpendicular relative to the plane of layers 101-108, 110, 112 and 111.

In embodiments where the SPEL 105 is not employed, the arrow 131 indicates the magnetic orientation of the fixed layer 103.

In prior art memory modules with MTJs and STTMRAMs, the magnetic orientation of the free layer (or composite free layer) and fixed layer (or composite fixed layer) is parallel to the surface of the various layers (or substrate). Achieving perpendicular magnetic orientation of the free and fixed layers requires proper growth methods and alloy selection.

The underlayer 102 serves to promote a desired crystalline growth, such as L10, for the layers subsequently above the underlayer 102 during film deposition and/or during the post annealing process.

In some embodiments, fixed layer 103 is a magnetic alloy, particularly an FePt with at least one of X or Y alloy, to ensure proper cubic (001) crystal growth. In one embodiment and method of the present invention, a thin SPEL (SPEL 105), typically less than 3 nano meters (nm) thick, is deposited upon fixed layer 103, prior to the deposition of tunnel layer 107. The SPEL 105 may be largely amorphous (greater than 50% by volume), to ensure cubic (001) growth of the crystal planes of tunnel layer 107. Cubic-on-cubic growth of an amorphous SPEL 105 and tunnel layer 107 ensures a high tunnel magnetoresistance (TMR) within MTJ 120.

Composite free layer 114, in an exemplary embodiment, comprises at least two layers, in accordance with an embodiment of the present invention. Specifically, as shown in FIG. 1, composite free layer 114 comprises SPEL 108, for enhancing the spin-polarization of electrons passing through MTJ 120, and free layer 110. In an exemplary embodiment, free layer 110 is made of FePt with at least X or Y alloy, having, as described earlier, a perpendicular magnetic orientation.

During a write operation, a bidirectional electric current is applied across the STTMRAM element 100 including the MTJ 120. The electric current becomes spin polarized by transmission through or by reflection from the fixed layer 103. The spin polarized current exerts a spin torque on the magnetic moment of the free layer 110 when it passes through it. The spin torque causes the magnetic moment of the free layer 110 to switch from a parallel state to an anti-parallel state or vice versa when the electric current density is sufficiently high. The magnetic moment of the free layer 110 can be switched to be parallel or anti-parallel relative to the magnetization direction of the fixed layer 103, depending on the direction of electric current flow.

For example, in the embodiment of FIG. 1, when electric current flows from the cap layer 112 down to the bottom electrode, in the manner shown by the arrow 1000, the magnetization direction of the free layer 110 is switched to a parallel direction relative to that of the fixed layer 103 and if electric current flows from the BE 101 to the cap layer 112, in a manner shown by the arrow 1001, the magnetization direction of the free layer 110 is anti-parallel relative to the fixed layer 103. The parallel magnetization configuration corresponds to a low resistance state (the logical "0") of the MTJ 120. The anti-parallel magnetization configuration corresponds to a high resistance state (the logical "1") of the MTJ 120. When the free layer 110 is in a parallel magnetization state, the arrow 133 is in the same direction as that of the arrow 131 and when the free layer 110 is in an anti-parallel magnetization state, the arrow 133 is in an opposite direction as that of the arrow 131.

Stated differently, switching current, which is the spin polarized current, when applied and flowing in a direction shown by the arrow 1001, flows through the STTMRAM element 100 in a direction from the layer 101 through subsequent layers and finally through the cap layer 112 or in a direction opposite thereto that is in a direction from the top electrode 111 through to the bottom electrode layer 101, as shown by the arrow 1000. While, in FIG. 1, the STTMRAM element 100 is shown to include bottom stacking where the free layer 110 is formed on top of the fixed layer 103, top stacking may be employed where the fixed layer 103 is formed on top of the free layer 110.

$H_k$, which represents the perpendicular anisotropy field of the element 100, is preferably of the following relationship with respect to Ms: $H_k$>4$\pi$Ms, in order to ensure a perpendicular anisotropy orientation.

The composite fixed layer 115 or the fixed layer 103, each has a magnetization that is substantially fixed in one direction. The composite free layer 114 has a magnetization that is switchable between a parallel state, where the direction of its magnetization is parallel relative to that of the composite fixed layer 115, and anti-parallel state where the direction of its magnetization is anti-parallel relative to that of the composite fixed layer 113. During a write operation, a bidirectional electric current (1000 and 1001) is applied across the STTMRAM element 100 to switch the magnetization of the free layer 110 between parallel and anti-parallel states relative to the magnetization of the composite fixed layer 115.

It should be pointed out that while the SPEL layers 105 and 108, when deposited by themselves, tend to prefer to have an in-plane (i.e., perpendicular to the arrows 131 and 133) magnetization orientation, that in the presence of the fixed and free layers, respectively, the magnetization orientation of the SPEL layers 105 and 108 become perpendicular, as shown by the arrows 131 and 133, respectively.

Figure 2:
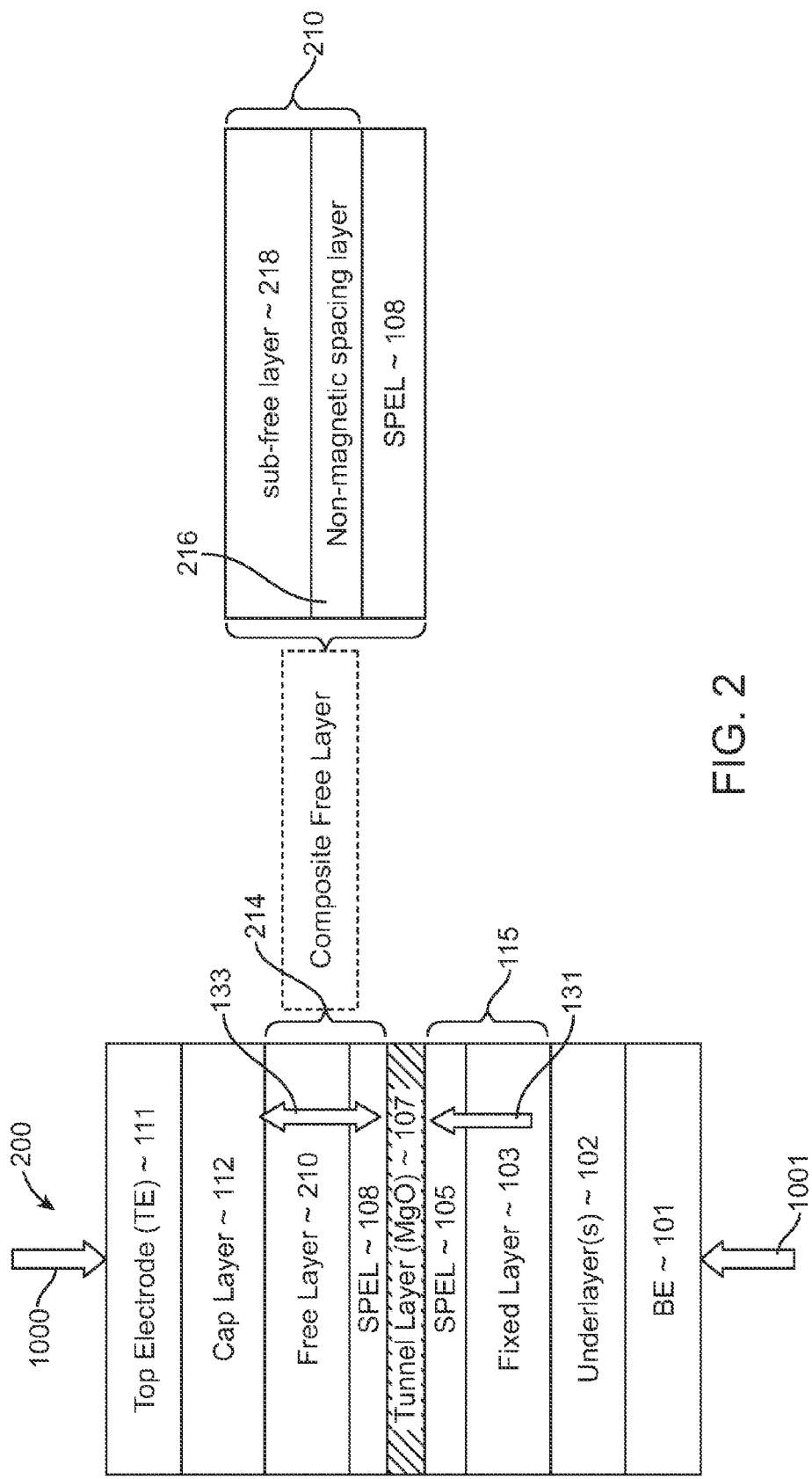
FIG. 2 shows the layers of STTMRAM element 200, in accordance with another embodiment of the present invention.

Referring now to FIG. 2, relevant layers of STTMRAM 200 are shown, in accordance with another embodiment of the present invention. STTMRAM 200 is analogous to STTMRAM 100, except for the composition of the free layer 210 of the composite free layer 214. The composite free layer 214 includes one more layer than that of the composite free layer 114. The composite free layer 214 is shown formed on top of the tunnel layer 107 and above the composite layer 214 is shown formed the cap layer 112. The free layer 210 is shown formed of the SPEL 108.

In one embodiment of the present invention, the additional layer of the composite free layer 214 is a non-magnetic spacing (or coupling) layer 216. That is, the composite free layer 214 is shown comprising the SPEL 108, the non-magnetic spacing layer 216 and a sub-free layer 218. The free layer is itself composite and formed on the layers 216 and 218. The layer 216 is shown formed on top of the SPEL 108 and on top of the layer 216 is shown formed the sub-free layer 218 and on top of the layer 218 is shown formed the cap layer 112. The layers of the composite free layer 214 are shown on the right side of FIG. 2. In one embodiment, the layer 216 is made of a ruthenium alloy (RuZ where Z is one of a number of materials, such as chromium, Cr, molybdenum, Mo, tungsten, W, iridium, Ir, tantalum, Ta, or rhodium, Rh). In one embodiment, Z is less than (<) 40 atomic percent of the RuZ material.

The layer 218 and the SPEL 108 are interlayer exchange coupled through the non-magnetic spacing layer 216. In one embodiment, the layer 218 and the SPEL 108 are ferromagnetically coupled and in another embodiment, they are anti-ferromagnetically coupled.

In an exemplary embodiment, the sub-free layer 218 is made of FePt with either X, Y or both alloys (XY). Layer 216 is deposited between SPEL 108 and the sub-free layer 218 to increase magnetic coupling of the same.

In an exemplary embodiment, the layer 216 is made of the alloy RuZ where Z is less than 40 atomic percent of one or more of the following elements: Chromium (Cr), Molybdenum (Mo), W, Iridium (Ir), Tanatalum (Ta), and/or Rhodium (Rh).

As discussed relative to FIG. 1, the element 200 is written thereto by applying a electric current thereto, which results in spin current or switching current flowing through layers to switch the magnetic state of the composite free layer 214.

Figure 3:
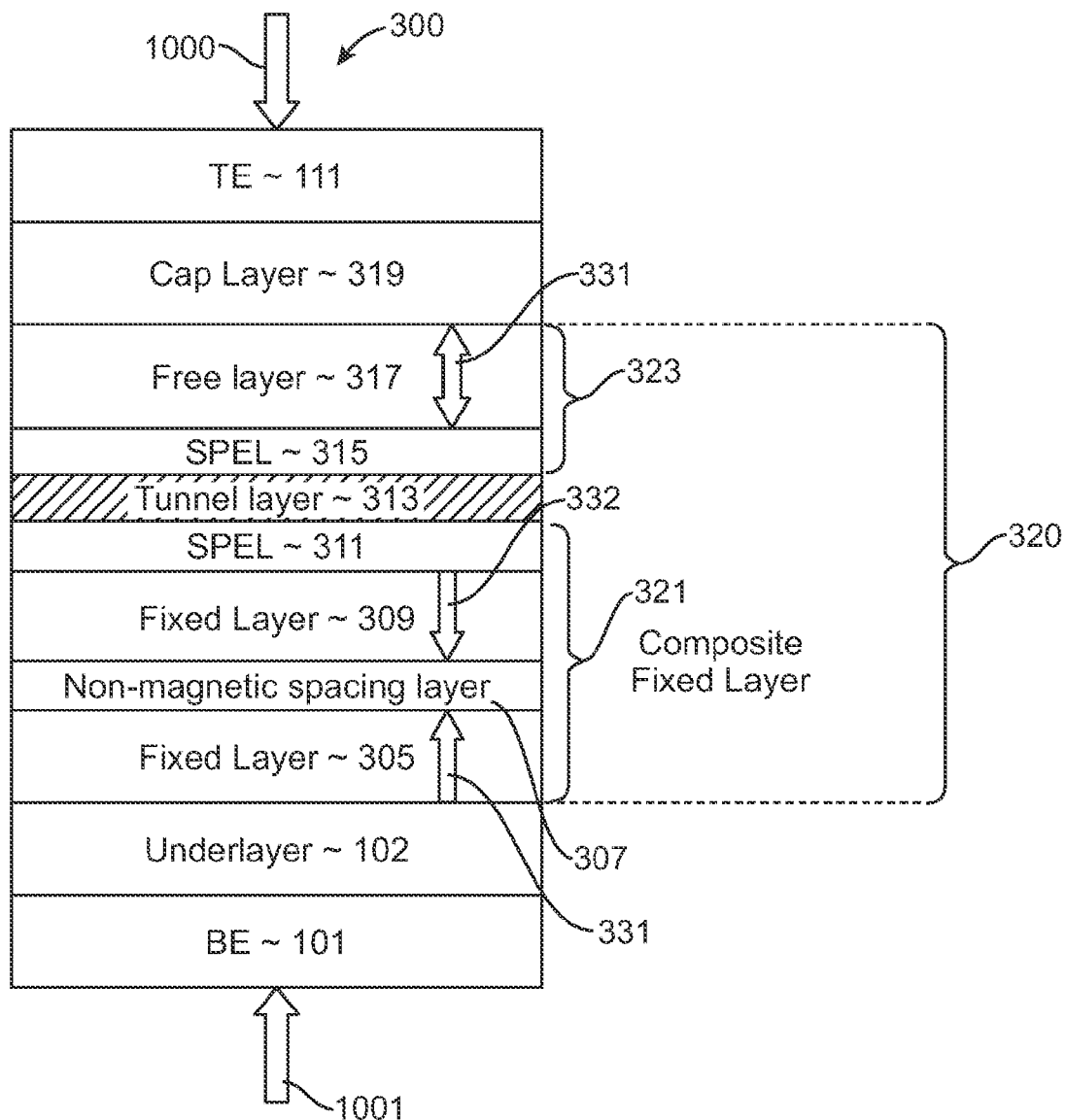
FIG. 3 shows the layers of STTMRAM element 300, in accordance with another embodiment of the present invention.

Referring now to FIG. 3, relevant layers of STTMRAM element 300 are shown, in accordance with another embodiment of the present invention. STTMRAM element 300 is shown to comprise: bottom electrode 101, underlayer(s) 102, fixed layer 305, non-magnetic spacing layer 307, fixed layer 309, SPEL 311, tunnel layer 313, SPEL 315, free layer 317, cap layer 319 and TE 111. BE 101 is formed on a substrate or film (not shown in FIG. 3). Underlayer 102 is shown formed on top of the BE 101, fixed layer 305 is shown formed on top of underlayer 102, non-magnetic spacing layer 307 is shown formed on top of fixed layer 305, fixed layer 309 is shown formed on top of the non-magnetic spacing layer 307, SPEL 311 is shown formed on top of the fixed layer 309, the tunnel layer 313 is shown formed on top of the SPEL 311, the SPEL 315 is shown formed on top of the tunnel layer 313, the free layer 317 is shown formed on top of the SPEL 315, the cap layer 319 is shown formed on top of the free layer 317 and the TE is shown formed on top of the cap layer 319.

The layers 305-317 together comprise the MTJ 320. The fixed layer 305, the non-magnetic spacing layer 307, the fixed layer 309, and the SPEL 311, together comprise composite fixed layer 321. The free layer 317 and the SPEL 315 together form the composite free layer 323. In one embodiment of the present invention, the layer 307 is made of RuZ, as earlier discussed. As earlier indicated, in an exemplary embodiment, the SPEL 311 is made of CoFeB or other material indicated herein. The fixed layers 305 and 309 each may be made of an FePtXY alloy. The pinned magnetic orientations of the fixed layers 305 and 309 are anti-parallel relative to each other. Arrows 331, 332, and 333 indicate the magnetic orientation of fixed layer 305, fixed layer 309, and free layer 317, respectively. As indicated by arrows 331-333, the magnetic orientation of these layers is perpendicular to the surface of the layers (or the plane of the film or substrate) through which tunneling electrons pass. Having two fixed layers (305 and 309) with perpendicular, anti-parallel magnetic orientation advantageously ensures low demagnetizing field of the free layer 323 by cancelling or adjusting the net magnetization as indicated by arrows 331 and 332. Such structures tend to provide a more symmetric switching current whereby the switching current when the free layer is switching from a parallel to an anti-parallel state is nearly close to that of as the switching current when the free layer is switching from an anti-parallel to a parallel state. To achieve substantially identical switching current density, $J_{co}$, associated with the MTJ 320, from a parallel to an anti-parallel state and from an anti-parallel to a parallel state, the thicknesses of the fixed layers 305 and 309 may need to be optimized.

In an exemplary embodiment, the fixed layer 305 and the fixed layer 309 may be each made of an alloy of FePt with X and/or Y (or FePtX, FePtY or FePtXY), where X and Y are made of material indicated hereinabove. For example, alloy FePtXY may be an alloy of FePtNiTaB. Where the FePtXY alloy includes Ni, it may include less than 40 atomic percent of Ni, to enable a lower $M_s$ and lower transformation temperature, ensuring an L10 crystalline structure for the magnetic fixed layers 305 and 309. Utilizing Cu and B also help to reduce the L10 transformation temperature to below 400° C. The $M_s$ or magnetization of an alloy containing only FePt is about 1140 electron mass unit (emu)/cubic centimeter (cc). When the alloy is diluted with Ni, Ta, Ti, and/or B, the $M_s$ is quickly reduced. For example, 10 atomic percent of Ni drops the $M_s$ of the alloy to 1070 emu/cc. Addition of other materials reduces the alloy's $M_s$ further still. Including 10 atomic percent of Ta as well as Ti, for an FePtNiTa(Y) alloy, drops the alloy's $M_s$ to about 700-800 emu/c.

Various other suitable FePtXY alloys are contemplated in accordance with an embodiment of the present invention. These include, for example, FePtTaB, FePtTiB, FePtCuB, FePtNiTaB. Further examples of appropriate FePtXY alloys include, for example, an FePtTaB alloy of less than 50 atomic percent of Fe, less than 50 (and substantially equal to that of the Fe) atomic percent of Pt, 3-20 atomic percent of Ta, and 3-20 atomic percent of B (with the understanding that the total atomic percent should clearly not exceed 100%); an FeNiPtTaB alloy of 45 atomic percent of Fe, 10 atomic percent of Ni, 45 atomic percent of Pt, 2-12 atomic percent of Ta, and 12-26 atomic percent of B; an FePtTaCuB alloy of 40 atomic percent of Fe, 50 atomic percent of Pt, 2-8 atomic percent of Ta, 6-12 atomic percent of Cu, and 10-22 atomic percent of B; and an FeNiPtTaCuB alloy of 45 atomic percent of Fe, 10 atomic percent of Ni, 45 atomic percent of Pt, 2-8 atomic percent of Ta, 6-12 atomic percent of Cu, and 10-22 atomic percent of B.

BE 101 may be a layer that efficiently conducts current, and may comprise one or more layers of Ta, NiNb, TaN, TiN, CrN, or AlN. BE 101 enables crystalline growth of the CrX alloy(s) of underlayer 102. Ensuring crystalline growth of the Cr (200) planes of underlayer 102 ensures (001) cubic crystalline growth of the magnetic FePtXY layers, through lattice matching epitaxial growth. Crystalline plane growth increases the TMR, and reduces the resistance-area product (RA) of MTJ 320, thus improving the performance of the MTJ.

In the various embodiments of the present invention, the underlayer 102 may be or may include as one of its layers, a seed layer. In an exemplary embodiment, this seed layer is made of Ta, NiNb, TaN, TiN, CrN or AlN.

In accordance with an alternative embodiment of the present invention, a thin layer of Pt may be deposited upon the underlayer 102, and before the deposition of fixed layer 305.

The composition of underlayer 102 may be selected from a variety of CrX alloys, where X may be one of numerous elements, such as, for example Cr—Mo, Cr—W, Cr—Ru, Cr—Ta, Cr—Ti, Cr—B, or Cr—Zr. Further, the composition of the underlayer 102 may be selected from a combination of these, such as, for example, CrMoB, CrTiB, CrMoTa, or CrMoW. For these alloys, X should be less than 30 atomic percent of the selected element(s).

The layer 307 may be an Ru—Z alloy where Z is less than 40 atomic percent of one or more of the following elements: Cr, Mo, W, Ir, Ta, and/or Rh.

In an exemplary embodiment, the cap layer 319 is made of Ta, the layer 317 is made of FePtTaB, the layers 315 and 311 are each made of material that is analogous to that of the SPEL 108 or 105, and the tunnel layer 313 is made of material that is analogous to that of the layer 107.

The layer 305 and the layer 309 are interlayer exchange coupled through the non-magnetic spacing layer 307. In one embodiment, the layer 305 and the layer 309 are ferromagnetically coupled and in another embodiment, they are preferably anti-ferromagnetically coupled.

Figure 4:
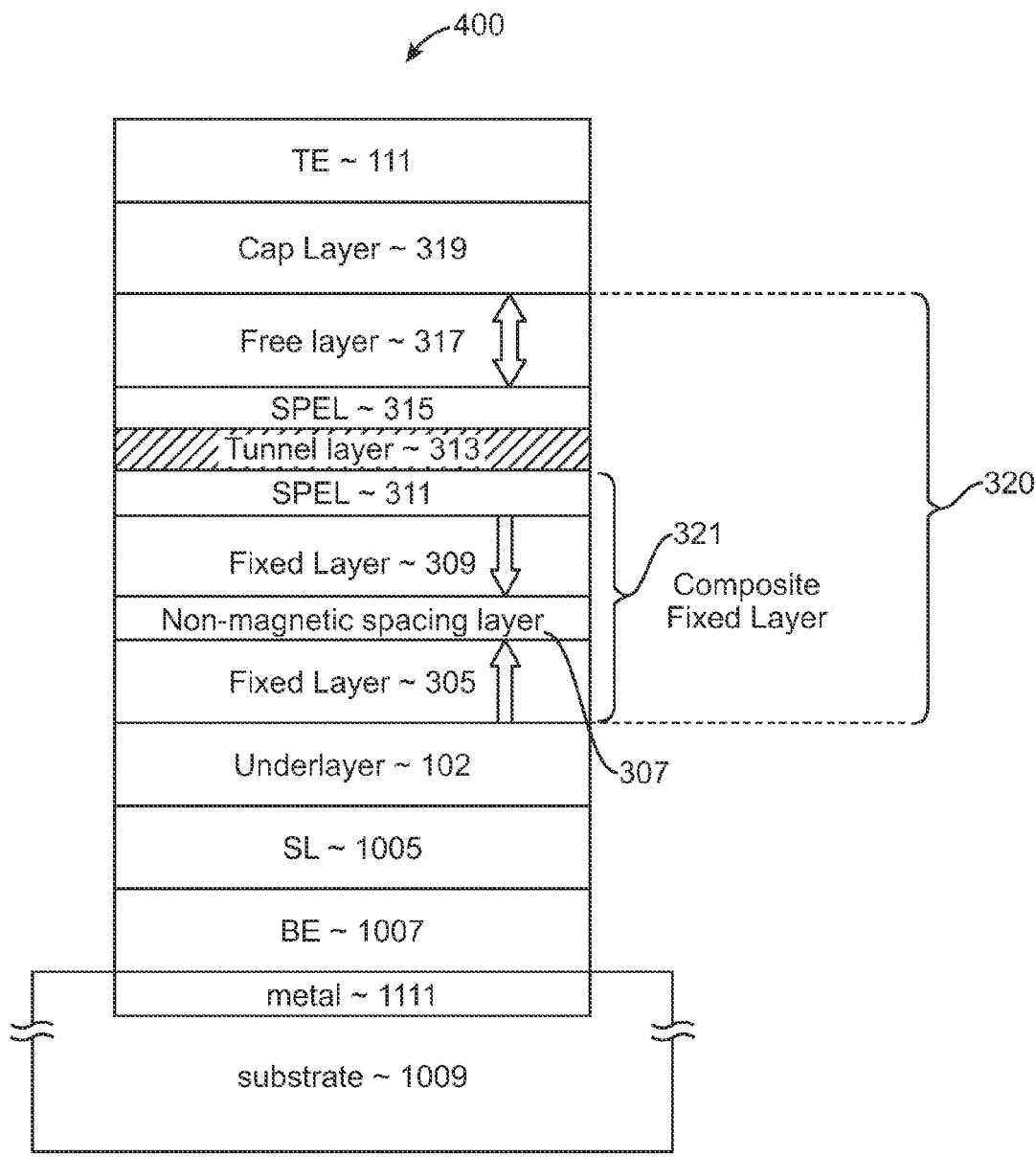
FIG. 4 shows the layers of STTMRAM element 400, in accordance with another embodiment of the present invention.

FIG. 4 shows a STTMRAM element 400 in accordance with another embodiment of the present invention. The element 400 is analogous to the element 300 of FIG. 3 except that a substrate 1009 is shown upon which the element 400 is formed and on top of a metal area 1111 of the substrate 1009 is shown formed a bottom electrode 1007 and on top of the BE 1007 is shown formed a seed layer 1005 and on top of the seed layer 1005 is shown formed the underlayer 102 with the remainder of the layers of the element 400 being the same as and in the same location as the element 300.

In one embodiment of the present invention, the underlayer 102 is made of CrX with X being less than thirty atomic percept of one or more of the materials: Mo, W, Ru, Ta, Ti, B or Zr.

In an exemplary embodiment, the seed layer 1005 is made of one or more conducting layers, such as but not limited of Ta, NiB, NiNb NiAl, NiRu, TaN, TiN, CrN or AlN. The role of the seedlayer is to allow better crystalline growth of the underlayer, which leads to improved crystalline growth of subsequent magnetic layers.

Figure 5:
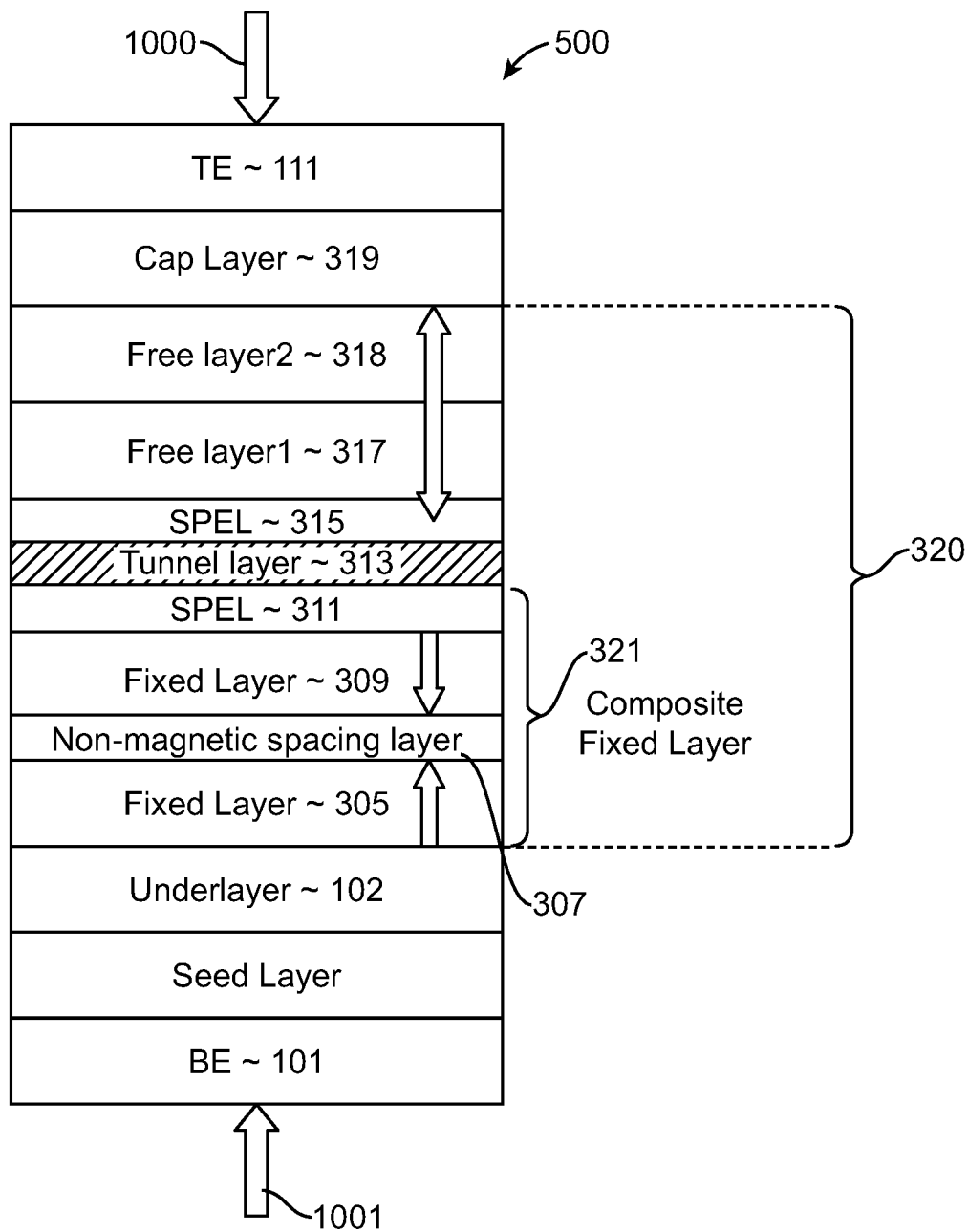
FIG. 5 shows the layers of STTMRAM element 500, in accordance with another embodiment of the present invention.

FIG. 5 shows a STTMRAM element 500 in accordance with another embodiment of the present invention. The element 500 of FIG. 5 is analogous to the element 400 of FIG. 4 except that the free layer of the element 500 is made of multiple layers, namely, the first free layer 317 formed on top of the SPEL 315 and the second free layer 318 formed on top of the first free layer 317. The cap layer 319 is formed on top of the second free layer 318. In the foregoing embodiments, the SPELs 311 and 315 need not have a perpendicular magnetic moment.

In an exemplary embodiment, the first free layer has a higher anisotropy than the second free layer. For example, the second free layer may have an anisotropy that is less than 50% of that of the first free layer. In yet another exemplary embodiment, the first free layer 317 has a higher dispersion of the easy axis of magnetization than that of the second free layer 318. The dispersion of the easy axis of magnetization is typically represented by delta-theta 50 ($\Delta\Theta 50$) which is measured by using an x-ray diffractometer.

A higher $\Delta\Theta 50$ refers to having higher dispersion and vice versa. A lower value of $\Delta\Theta 50$ represents a more oriented magnetic structure. In one embodiment, the $\Delta\Theta 50$ of the free layer 317 is greater than 10 degrees and the $\Delta\Theta 50$ of the free layer 318 is less than 10 degrees and more typically below 7 degrees. A typical thickness of free layer 317 and free layer 318 is 0.2 nm to 3 nm. In one embodiment the free layer 317 is 0.5-1 nm and the free layer 318 is 0.8-2 nm.

STTMRAM element 500 is expected to have a lower switching current density in that the switching typically starts in the free layer 317 at a lower current and thereby initiates the magnetization switching of the entire free layer in the manner taught in U.S. patent application Ser. No. 11/776,692 filed on Jul. 12, 2007, and entitled "Non-volatile magnetic memory element with graded layer" by Rajiv Yadav Ranjan, which is herein incorporated by reference as though set forth in full.

Figure 6:
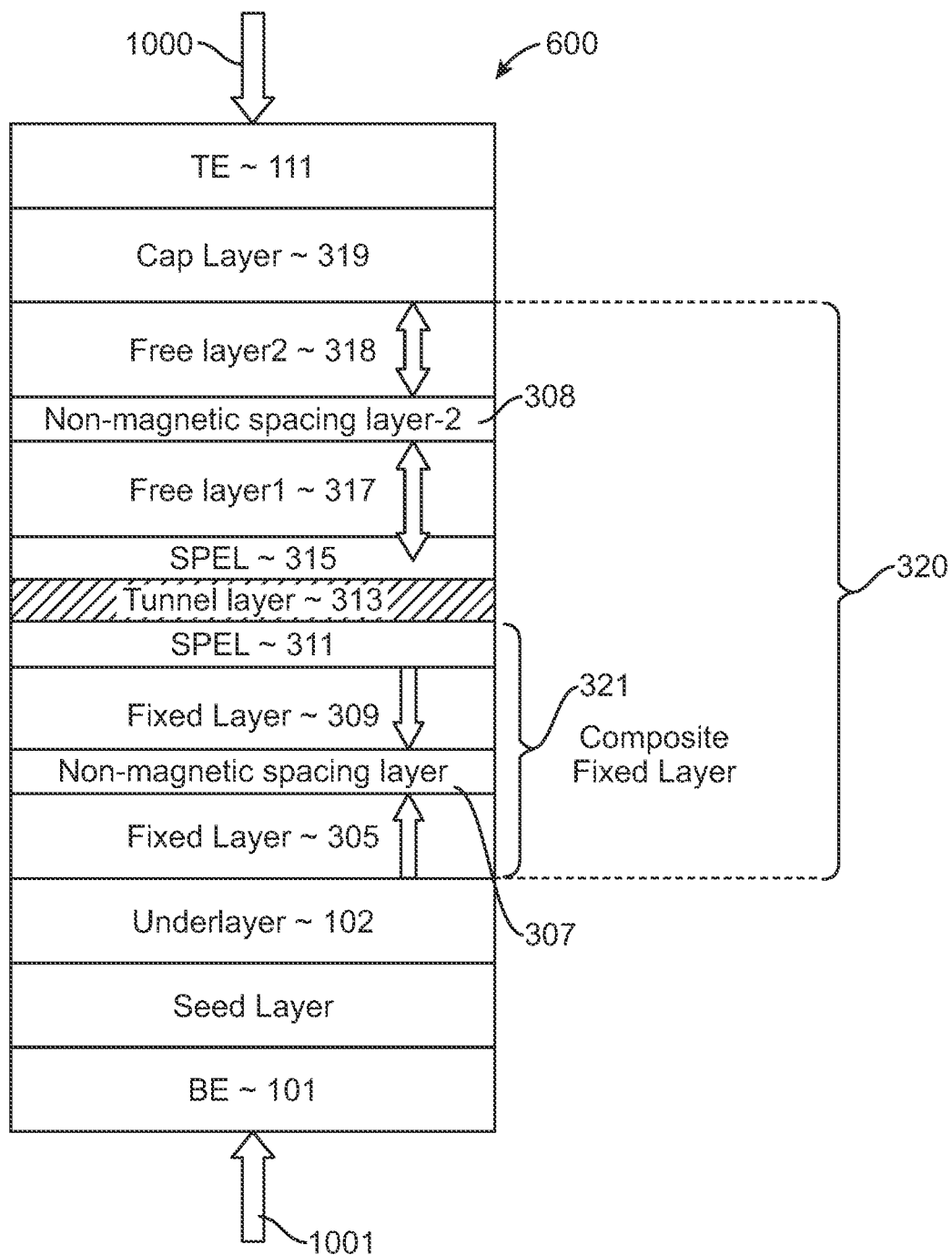
FIG. 6 shows the layers of STTMRAM element 600, in accordance with another embodiment of the present invention.

FIG. 6 shows a STTMRAM 600 in accordance with yet another embodiment of the present invention. The element 600 is analogous to that of the element 500 except that a second non-magnetic spacing layer 308 is shown formed between the first free layer 317 and the second free layer 318. The second non-magnetic spacing layer 308 is made of the same material as the layer 307. The direction of magnetization, shown by the arrows 131 and 133, depends on the thickness of the non-magnetic spacing layer 308 which is comprised of Ru—Z alloy described earlier. The magnetic coupling is ferromagnetic if the two magnetization vectors (shown by the arrows) are aligned in the same direction and this typically happens when the Ru—Z spacing layer is below 0.85 nanometers (nm). The magnetic coupling is anti-ferromagnetic when the magnetization vectors are anti-parallel (as shown for the composite fixed layer 321). STTMRAM 600 is expected to have a lower switching current due to the lower demagnetizing field.

In the various embodiments of the present invention, an optimal Ku and Ms combination of Ku and Ms are employed for reliable single domain switching and to lower the damping constant.

In some embodiments, some of the free layers of the various embodiments of the present invention are made of at least two layers of FePtXY and in this respect, the free layer is considered to be a graded layer with one embodiment thereof having one free layer have a higher anisotropy than the free layer that is formed on top thereof. In another embodiment, the graded design includes a higher dispersion angle associated with one free layer than that of the free layer that is formed on top thereof.

In some embodiments, the free layer is synthetic and has a perpendicular magnetic moment. In some embodiments, the free and fixed layers are synthetic. In some embodiments, the free layer is comprised of FePtXY like a granular film and likely to provide better uniformity of the magnetic properties over the wafer or from wafer-to-wafer. In some embodiments, the free layer is granular and made of FePtXY and the free layer and the fixed layer are synthetic.

Various alternative embodiments of the present invention are now discussed. In each of the embodiments of FIGS. 1 through 3, the underlayer can be multiple layers. In one embodiment, the seedlayer can contain one or more conducting layers made of: Ta, NiNb, TaN, TiN, CrN, or AlN.

In some embodiments, some of the free layers of the various embodiments of the present invention are made of at least two layers of FePtXY and in this respect, the free layer is considered to be a graded layer with one embodiment thereof having one free layer have a higher anisotropy than the free layer that is formed on top thereof. In another embodiment, the graded design includes a higher dispersion angle associated with one free layer than that of the free layer that is formed on top thereof.

In an alternative embodiment, FePtNi replaces FePt in the free or fixed layer.

In some embodiments, the cap layer and the underlayer can each include at least one of Y. In another embodiment, Y is <30 atomic percent (%). In other embodiments, the cap layer and the underlayer can each include X.

In one embodiment, FePt has roughly atomic percentage that is equal between Fe and Pt.

In some embodiments, the SPELs do not have perpendicular anisotropy.

The STTMRAM element of the various embodiments of the present invention are submicron-sized or nano-scaled.

In any of the foregoing embodiments where the material FePtXY can be employed, FePtXYZ1 where 'Z1' is one or more of SiO2, TiO2, Ta2O5, ZrO2, TaN, TiN may be employed in place of FePtXY. The FePtXYZ1 mentioned above is also referred to as a granular alloy, mentioned above. In such cases the magnetic grains of the FePtXY alloy is generally isolated by segregation of Z1 (one or more of SiO2, TiO2, Ta2O5, ZrO2, TaN, TiN).

The structures including layers of the various drawings included herein are not necessarily drawn to scale. The thicknesses of the lines in the drawings are arbitrary and do not represent actual thicknesses or sizes of structures associated therewith.

Although the present invention has been described in terms of specific embodiment, it is anticipated that alterations and modifications thereof will no doubt become apparent to those more skilled in the art. It is therefore intended that the following claims be interpreted as covering all such alterations and modification as fall within the true spirit and scope of the invention.

What is claimed is:

1. A spin-torque transfer memory random access memory (STTMRAM) element comprising:
    a fixed layer having a first magnetization that is substantially fixed in one direction and formed on top of a substrate;
    a tunnel layer formed upon the fixed layer; and
    a composite free layer having a second magnetization that is switchable in two directions and formed upon the tunnel layer and made of an iron platinum alloy including at least one of X material and at least one of Y material, wherein X comprises: phosphorous (P), and nitrogen (N) and Y comprises: silicon (Si), aluminum (Al), tin (Sn), lead (Pb), antimony (Sb), and bismuth (Bi), the magnetization direction of each of the composite free layer and fixed layer being substantially perpendicular to the plane of the substrate,
    wherein during a write operation, a bidirectional electric current is applied across the STTMRAM element to switch the second magnetization between parallel and anti-parallel states relative to the first magnetization.

2. The STTMRAM, as recited in claim 1, further including one or more underlayers formed between the substrate and the fixed layer.

3. The STTMRAM, as recited in claim 2, wherein the one or more underlayers causes a crystalline growth of L10 of the fixed layer, the tunnel layer and the composite free layer.

4. The STTMRAM, as recited in claim 2, further including a bottom electrode (BE) formed between the substrate and the one or more underlayers.

5. The STTMRAM, as recited in claim 1, further including a cap layer formed on top of the composite free layer.

6. The STTMRAM, as recited in claim 5, further including a top electrode (TE) formed on the cap layer.

7. The STTMRAM, as recited in claim 1 wherein the fixed layer is a composite layer.

8. The STTMRAM, as recited in claim 7, wherein the composite fixed layer includes a enhanced spin-polarization interface layer (SPEL) formed on top of the fixed layer and below the tunnel layer.

9. The STTMRAM, as recited in claim 8, wherein the SPEL is made of a cobalt iron boron (CoFeB)-based alloy.

10. The STTMRAM, as recited in claim 8, wherein the SPEL is made of CoFe-based alloys.

11. The STTMRAM, as recited in claim 10, wherein the CoFe-based alloys are CoFeTa or CoFeZr.

12. A spin-torque transfer memory random access memory (STTMRAM) element comprising:
    a composite fixed layer having a first magnetization that is substantially fixed in one direction, the composite fixed layer formed on top of a substrate;
    a tunnel layer formed upon the composite fixed layer; and
    a composite free layer having a second magnetization that is switchable, formed upon the tunnel layer and made of an enhanced spin-polarization interface layer (SPEL), a non-magnetic spacing layer and a sub-free layer, the SPEL being formed on top of the tunnel layer, the non-magnetic spacing layer formed on top of the SPEL and the sub-free layer formed on top of the non-magnetic spacing layer, the composite free layer having a second magnetization that is switchable in two directions and made of an iron platinum alloy including at least one of X material and at least one of Y material, wherein X comprises: phosphorous (P), and nitrogen (N) and wherein Y comprises: silicon (Si), aluminum (Al), tin (Sn), lead (Pb), antimony (Sb), and bismuth (Bi), the magnetization direction of each of the composite free layer and the composite fixed layer being substantially perpendicular to the plane of the substrate; and
    a cap layer formed on top of the sub-free layer,
    wherein during a write operation, a bidirectional electric current is applied across the STTMRAM element to switch the second magnetization between parallel and anti-parallel states relative to the first magnetization.

13. The spin-torque transfer memory random access memory (STTMRAM) element, as recited in claim 12, wherein the non-magnetic spacing layer is made of a ruthenium alloy (RuZ) where Z comprises: chromium (Cr), molybdenum (Mo), tungsten (W), iridium (Ir), tantalum (Ta), or rhodium (Rh).

14. A spin-torque transfer memory random access memory (STTMRAM) element comprising:

a composite fixed layer having a first magnetization that is substantially fixed in one direction, the composite fixed layer formed on top of a substrate;

a tunnel layer formed upon the composite fixed layer; and a composite free layer having a second magnetization that is switchable, and formed upon the tunnel layer and made of an enhanced spin-polarization interface layer (SPEL), and the composite free layer having a second magnetization that is switchable in two directions and made of an iron platinum alloy including at least one of X material and at least one of Y material, wherein X comprises: phosphorous (P), and nitrogen (N) and wherein Y comprises: silicon (Si), aluminum (Al), tin (Sn), lead (Pb), antimony (Sb), and bismuth (Bi), the magnetization direction of each of the composite free layer and the composite fixed layer being substantially perpendicular to the plane of the substrate; and a cap layer formed on top of the composite free layer;

wherein during a write operation, a bidirectional electric current is applied across the STTMRAM element to switch the second magnetization between parallel and anti-parallel states relative to the first magnetization.

15. The STTMRAM, as recited in claim 14, further including one or more underlayers formed below the composite fixed layer.

16. The STTMRAM, as recited in claim 15, wherein the one or more underlayers causes a crystalline growth of L10 of the fixed layer, the tunnel layer and the composite free layer.

17. The STTMRAM, as recited in claim 15, further including a bottom electrode (BE) formed between the substrate and the one or more underlayers.

18. The STTMRAM, as recited in claim 14, further including a top electrode (TE) formed on the cap layer.

* * * * *

UNITED STATES PATENT AND TRADEMARK OFFICE
Certificate

Patent No. 8,593,862 B2

Patented: November 26, 2013

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Rajiv Yadav Ranjan, San Jose, CA (US); Roger Klas Malmhall, San Jose, CA (US) and Yiming Huai, Pleasanton, CA. (US).

Signed and Sealed this Twenty-fourth Day of June 2014.

RICHARD ELMS
*Supervisory Patent Examiner*
Art Unit 2824
Technology Center 2800